United States Patent [19]
Miyazaki

[11] Patent Number: 5,144,518
[45] Date of Patent: Sep. 1, 1992

[54] SEMICONDUCTOR INTEGRATED CIRCUIT
[75] Inventor: Yukio Miyazaki, Itami, Japan
[73] Assignee: Mitsubishi Denki Kabushiki Kaisha, Tokyo, Japan
[21] Appl. No.: 543,372
[22] Filed: Jun. 26, 1990
[30] Foreign Application Priority Data
  Oct. 23, 1989 [JP] Japan .................. 1-275417
[51] Int. Cl.⁵ .............. H02H 9/00; H01L 27/02
[52] U.S. Cl. ........................... 361/56; 357/41; 437/170
[58] Field of Search ............ 361/56, 57, 91, 88, 361/92; 357/41, 23.13, 23.8; 437/170-172

[56] References Cited
U.S. PATENT DOCUMENTS

| | | | |
|---|---|---|---|
| 4,044,373 | 8/1977 | Nomiya et al. | 357/41 |
| 4,112,670 | 9/1978 | Morozumi | 58/23 A |
| 4,617,482 | 10/1986 | Matsuda | 361/56 |
| 4,789,917 | 12/1988 | Miller | 361/56 |
| 4,858,055 | 8/1989 | Okifaka | 361/91 |
| 4,937,700 | 6/1990 | Iwahashi | 361/91 |

OTHER PUBLICATIONS

Japanese Patent Laying Open Gazette, No. 58-178632.
"Reverse Bias Over-Current Protection for Power Field-Effect Transistors", IBM Technical Disclosure Bulletin, vol. 29, No. 2, Jul. 1986, pp. 567-569.
"Microcomputer M50955 having High Breakdown Port", Mitsubishi pp. 2-218-2-221.
"Application Note: Vacuum Fluorescent Display", Futaba AN-1305.

Primary Examiner—Steven L. Stephan
Assistant Examiner—Matthew Nguyen
Attorney, Agent, or Firm—Oblon, Spivak, McClelland, Maier & Neustadt

[57] ABSTRACT

A semiconductor integrated circuit according to the present invention has a series circuit of a first field effect transistor and a load which is connected between a first potential point and a second potential point. The first field effect transistor operates in response to a control signal inputted in a gate thereof, whereby a high-level or low-level output signal is extracted from a node between the first field effect transistor and the load to output terminal. A second field effect transistor is also connected between the output terminal and the first potential point. Thus, when a surge causing the first field effect transistor to break down is applied to the output terminal, the second field effect transistor conducts to pass a surge current, whereby the first field effect transistor is prevented from being broken down.

5 Claims, 6 Drawing Sheets

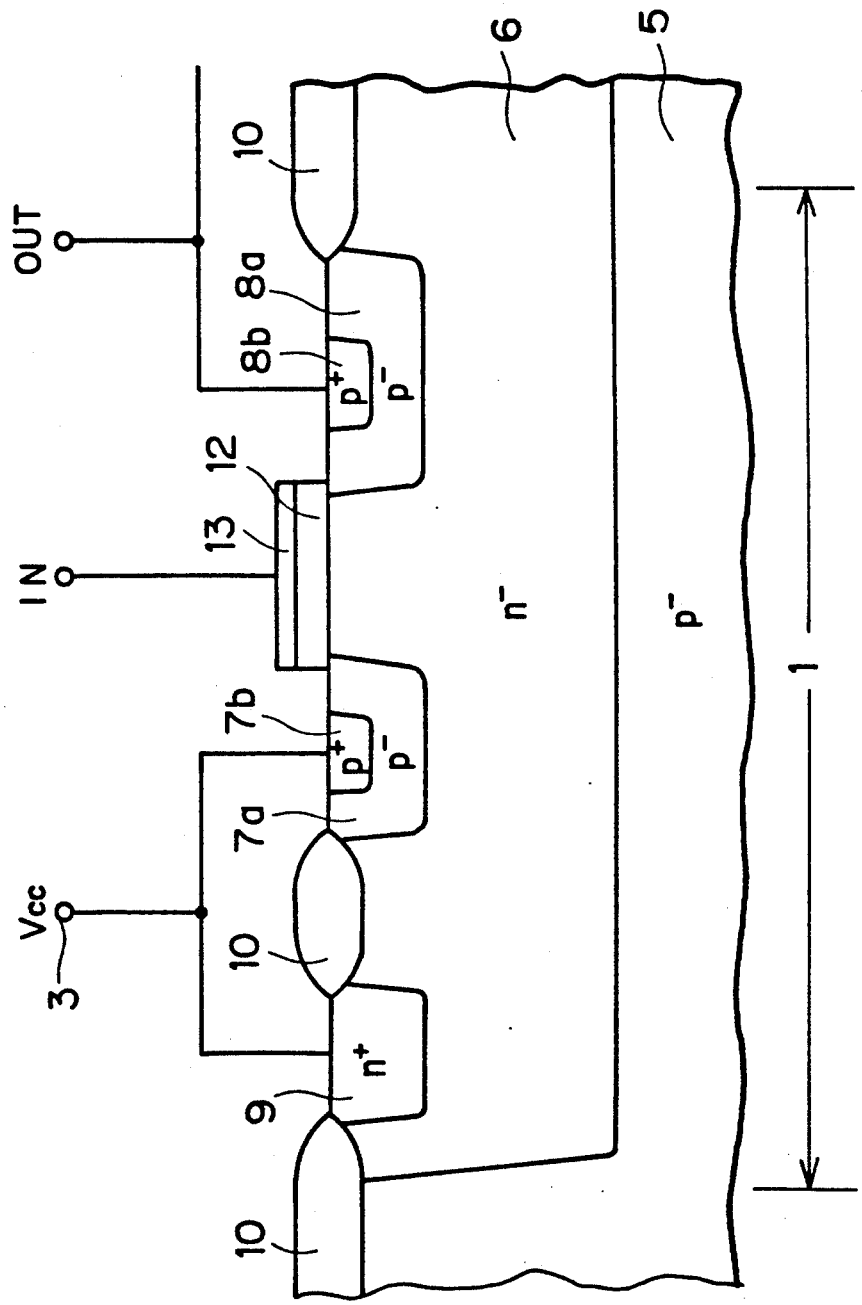

SEMICONDUCTOR INTEGRATED CIRCUIT

BACKGROUND OF THE INVENTION

1. Field of the Invention

The present invention relates to a semiconductor integrated circuit, and more particularly, it relates to a semiconductor integrated circuit which is suitable for improving a withstand surge voltage of an output circuit formed by high breakdown voltage field effect transistors.

2. Description of the Background Art

In recent years, a vacuum fluorescent display (VFD) or the like has been increasingly driven directly by the output from a micro controller unit (MCU) or a controller, and a semiconductor integrated circuit which contains a high voltage MOS transistor has been utilized as an output circuit for driving the same.

FIG. 6 shows a conventional output circuit for driving a VFD. As shown in FIG. 6, this output circuit comprises a high breakdown voltage p-channel MOS transistor 1 and a pulldown resistor 2 serving as a load. The p-channel MOS transistor 1 has a source and a bulk which are connected to a first power terminal 3, a gate which is connected to an input terminal IN and a drain which is connected to an output terminal OUT. The pulldown resistor 2 is connected between the drain of the p-channel MOS transistor 1 and a second power terminal 4. In general, a positive potential $V_{CC}$ of 5 V, for example, is applied to the first power terminal 3 from a high-potential power source, while a negative potential $V_P$ of $-35$ V, for example, is applied to the second power terminal 4 from a low-potential power source. A voltage of 0 to 5 V is applied to the input terminal IN as a control signal. A digit or segment of the VFD is connected to the output terminal OUT.

When the input terminal IN receives a high-level control signal of 5 V in this output circuit, the p-channel MOS transistor 1 is turned off so that the output terminal OUT receives the negative potential $V_P$ ($-35$ V) from the power terminal 4 and goes low. Thus, the VFD is not lit. When the input terminal IN receives a low-level control signal of 0 V, on the other hand, the p-channel MOS transistor 1 is turned on so that the output terminal OUT receives the positive potential $V_{CC}$ (5 V) from the power terminal 3 and goes high. Thus, the VFD is lit.

FIG. 7 is a sectional view schematically showing a semiconductor device implementing the output circuit shown in FIG. 6. As shown in FIG. 7, an $n^-$-type well 6 for serving as the bulk of the p-channel MOS transistor 1 is formed on a first major surface side of a $p^-$-type substrate 5. A $p^+$-type diffusion region 7 for serving as the source of the p-channel MOS transistor 1 and another $p^+$-type diffusion region 8 for serving as the drain thereof are provided on a surface side of the $n^-$-type well 6 to be spaced apart from each other. An $n^+$-type diffusion region 9 is provided adjacently to the $p^+$-type diffusion region 7, while a $p^+$-type diffusion region 11 is formed adjacently to the other $p^+$-type diffusion region 8 through a field oxide film 10 to serve as the pulldown resistor 2. Further, a gate electrode 13 is formed on a region of the $n^-$-type well 6 held between the two $p^+$-type diffusion regions 7 and 8 through an insulating layer 12. Thus, the p-channel MOS transistor 1 is defined by the $n^-$-type well 6, the $p^+$-type diffusion regions 7 and 8, the insulating layer 12 and the gate electrode 13. The $n^+$-type diffusion region 9 and the $p^+$-type diffusion region 7 are connected to the first power terminal 3 to which the positive potential $V_{CC}$ is applied, while the gate electrode 13 is connected to the input terminal IN. Further, the $p^+$-type diffusion region 8 and an end of the $p^+$-type diffusion region 11 are connected to the output terminal OUT, while the other end of the $p^+$-type diffusion region 11 is connected to the second power terminal 4, to which the negative potential $V_P$ is applied. This semiconductor device operates in the manner described above with reference to FIG. 6, and hence redundant description is omitted.

While FIG. 7 shows the high breakdown voltage p-channel MOS transistor 1 in the structure of an ordinary transistor for convenience of illustration, a high breakdown voltage structure which is implemented by a well-known technique such as double diffusion is appropriately selected and employed for an actual device. However, the p-channel MOS transistor 1 of the ordinary structure is not substantially different in operation from that of high breakdown voltage structure except for the point of breakdown voltage characteristics, and hence the description will be made below with reference to the device of the ordinary structure shown in FIG. 7.

In the conventional semiconductor integrated circuit having the aforementioned structure, a parasitic diode 14 (see FIG. 6) is defined between the output terminal OUT and the power terminal 3 by p-n junction of the $p^+$-type diffusion region 8 and the $n^-$-type well 6, as understood from FIG. 7. Therefore, it is necessary to consider the following surge countermeasure:

Consider that the output terminal OUT receives a plus (+) surge. In this case, a surge current is passed through a path along the output terminal OUT→the parasitic diode 14 ($p^+$-type diffusion region 8→the $n^-$-type well 6→the $n^+$-type diffusion region 9)→the power terminal 3, and hence a high withstand surge voltage is ensured.

Then, consider that the output terminal OUT receives a minus (−) surge. If the p-channel MOS transistor 1 is in an on state at this time, the surge current is passed through a path along the power terminal 3→the MOS transistor 1→the output terminal OUT, to cause no problem. However, if the p-channel MOS transistor 1 is in an off state, no electrical path for the surge current is defined since the impendance of the pulldown resistor 2 is generally set at a high level of several tens of KΩ in order to reduce power consumption. Consequently, the p-channel MOS transistor 1 is broken down and the surge current is passed through a path along the power terminal 3→the MOS transistor 1→the output terminal OUT. Thus, this semiconductor device has on extremely low breakdown voltage against the minus surge.

It may be considered to newly form a p-n diode in the $n^-$-type well 6 to draw out the aforementioned surge current from the output terminal OUT to the power terminal 4 through the p-n diode. However, it is impossible to form such a p-n diode since the $p^-$-type substrate 5 is connected to a GND potential in order to stabilize the operation of the transistor and the $n^-$-type well 6 cannot be set at a potential lower than the GND level.

In general, therefore, the gate width of the p-channel MOS transistor 1 is widened to disperse heat generated by the transistor operation, to thereby increase the withstand surge voltage.

FIG. 8 shows a general withstand surge voltage measuring circuit using a capacitor charging method. In this measuring circuit, a switch 15 is switched toward a first transfer contact 15a to apply a voltage to a capacitor 17 from a power source 16, to thereby charge the capacitor 17, as shown in FIG. 8. Thereafter the switch 15 is switched toward a second transfer contact 15b to discharge charges from the capacitor 17 to a device 19 through a resistor 18, to examine a breakdown state of the device 19. The voltage applied to the capacitor 17 is sequentially changed to examine the breakdown state of the device 19, to thereby detect breakdown voltage of the device 19.

FIG. 9 shows a result obtained by setting the capacity of the capacitor 17 at C=200 pF and the resistance of the resistor 18 at R=0 in the measuring circuit shown in FIG. 8 and measuring breakdown voltage of the output circuit shown in FIG. 6 in practice. Referring to FIG. 9, the longitudinal axis represents the breakdown voltage and the horizontal axis represents the gate width of the p-channel MOS transistor 1. As understood from FIG. 9, the withstand surge voltage is increased with on increase in gate width a. Since the transistor size is increased in proportion to the gate width, large transistor size is required in order to attain a high withstand surge voltage. For example, an extremely large transistor size is required with a gate width of 2000 $\mu$m, in order to ensure a withstand surge voltage of $-300$ V. When the gate width is thus widened, the current flowing in the transistor is increased. However, a segment drive for a VFD etc. generally requires a current of only several milliamperes, and hence such an increase of the current is wasted.

SUMMARY OF THE INVENTION

The present invention is directed to a semiconductor integrated circuit which is suitable for improving a withstand surge voltage of an output circuit formed by high breakdown voltage field effect transistors.

A semiconductor integrated circuit according to the present invention comprises an input terminal for receiving a control signal; a first field effect transistor having a first electrode and a bulk connected to a first potential point, a control electrode connected to the input terminal and a second electrode; a load connected between the second electrode of the first field effect transistor and a second potential point; an output terminal connected to the second electrode of the first field effect transistor; and a second field effect transistor having a first electrode and a control electrode connected to the output terminal, a second electrode connected to the second potential point and a bulk connected to the first potential point.

Accordingly, an object of the present invention is to provide a semiconductor integrated circuit which can improve a withstand surge voltage without increasing chip size, with no hindrance to ordinary operation.

According to the semiconductor integrated circuit of the present invention, when a surge causing the first field effect transistor to break down is applied to the output terminal, the second field effect transistor conducts to pass a surge current, whereby the first field effect transistor is prevented from being broken down. In other case, the second field effect transistor regularly remains in an off state to guarantee normal operation of the circuit.

These and other objects, features, aspects and advantages of the present invention will become more apparent from the following detailed description of the present invention when taken in conjunction with the accompanying drawings.

BRIEF DESCRIPTION OF THE DRAWINGS

FIG. 3 is a sectional view showing an essential part of a semiconductor device having exemplary high breakdown voltage structure;

DESCRIPTION OF THE PREFERRED EMBODIMENTS

Figure 1:
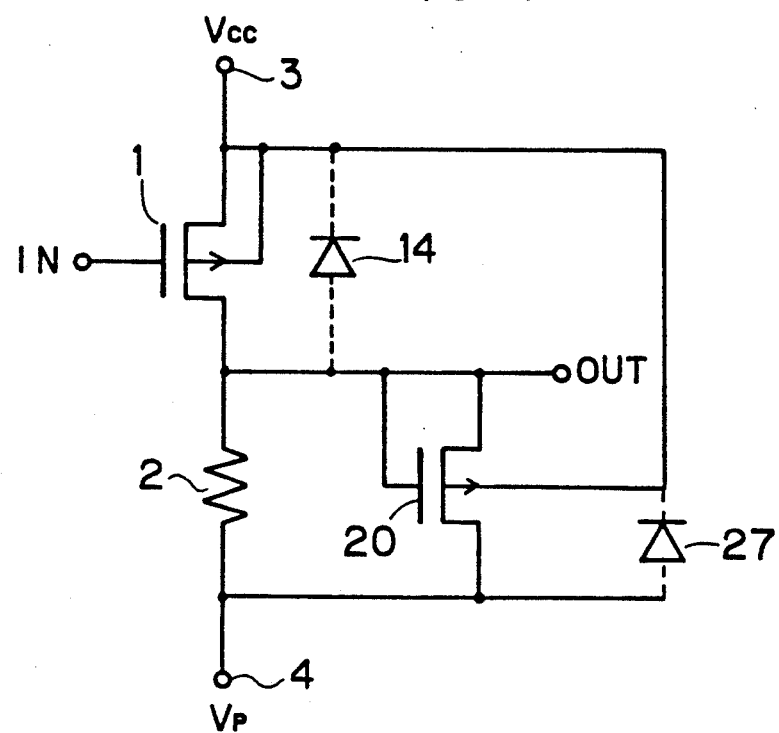
FIG. 1 illustrates a semiconductor integrated circuit according to an embodiment of the present invention.
Figure 6:
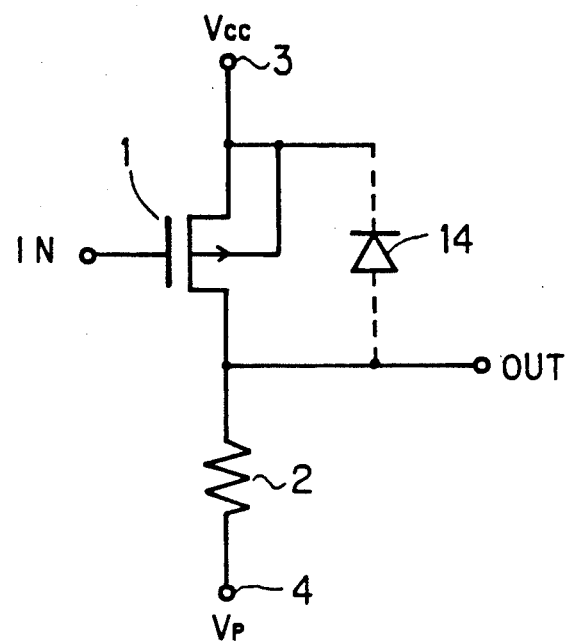
FIG. 6 illustrates a conventional output circuit for driving a VFD.
Figure 7:
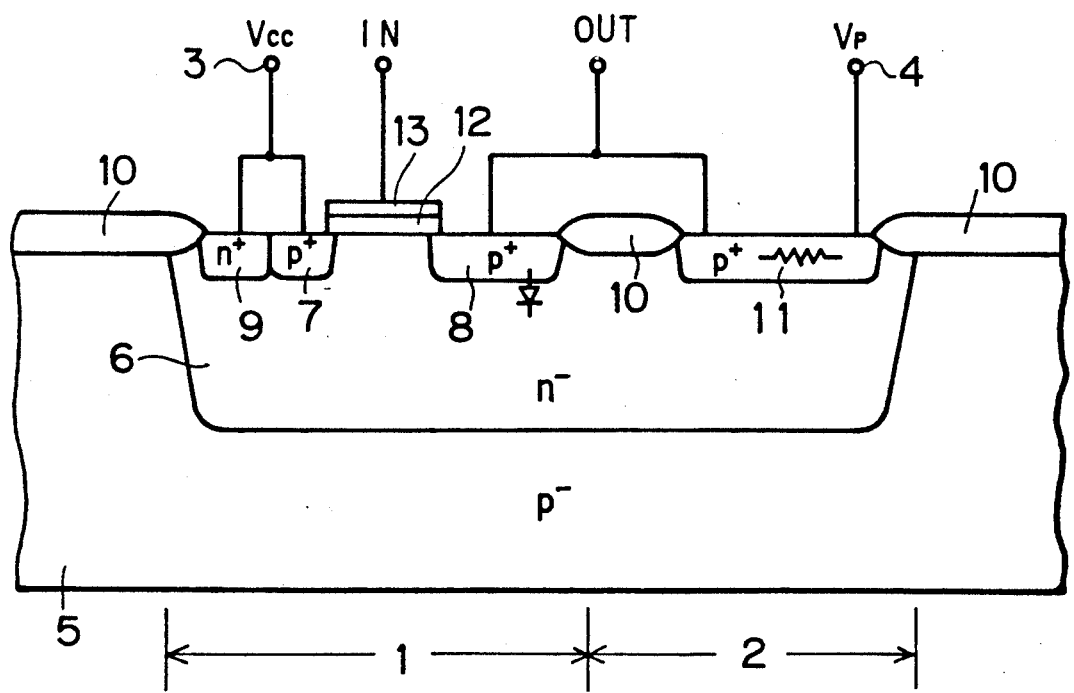
FIG. 7 is a sectional view schematically showing a semiconductor device implementing the circuit shown in FIG. 6.
Figure 8:
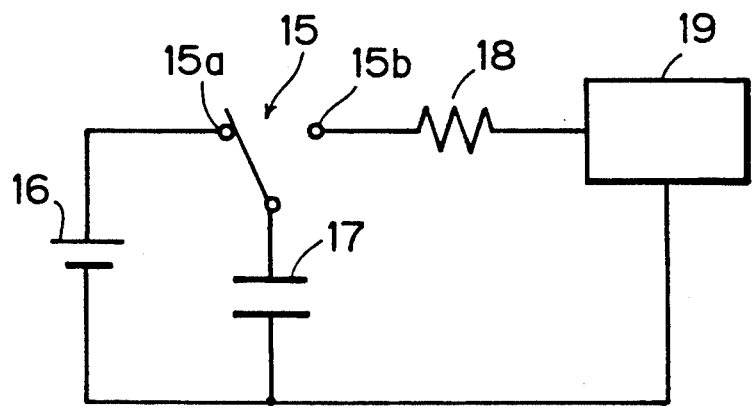
FIG. 8 illustrates a withstand surge voltage measuring circuit.
Figure 9:
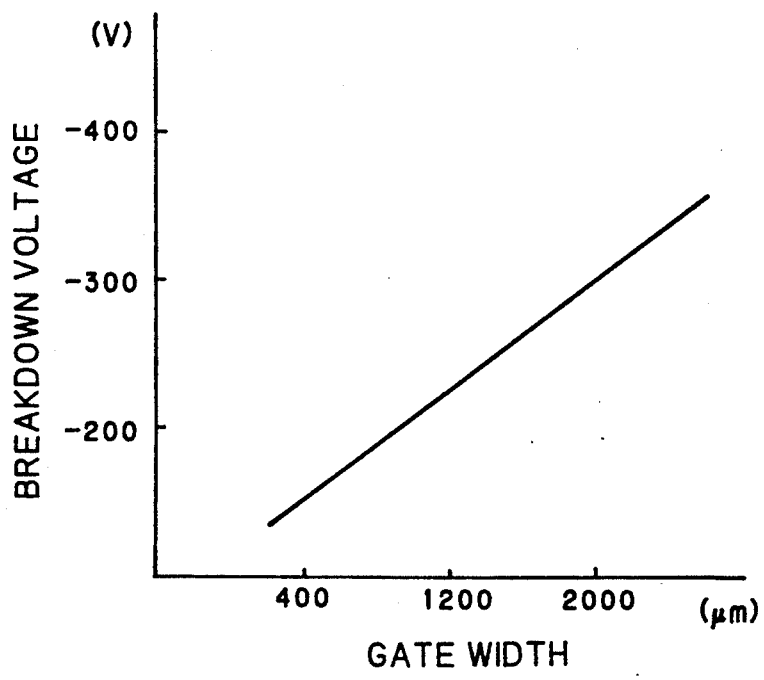
FIG. 9 illustrates relation between gate width of a MOS transistor and breakdown voltage.

FIG. 1 shows a semiconductor integrated circuit according to an embodiment of the present invention, which is formed as an output circuit for a VFD driver. As shown in FIG. 1, an additional high breakdown voltage p-channel MOS transistor 20 is connected between an output terminal OUT and a second power terminal 4 to which a negative potential $V_P$ is applied. This p-channel MOS transistor 20 has a drain and a gate which are connected to the output terminal OUT, a source which is connected to the power terminal 4 and a bulk which is connected to a first power terminal 3, to which a positive potential $V_{CC}$ is applied. This circuit is identical in other structures to the output circuit shown in FIG. 6, and hence identical parts are denoted by the same reference numerals to omit redundant description.

Figure 2:
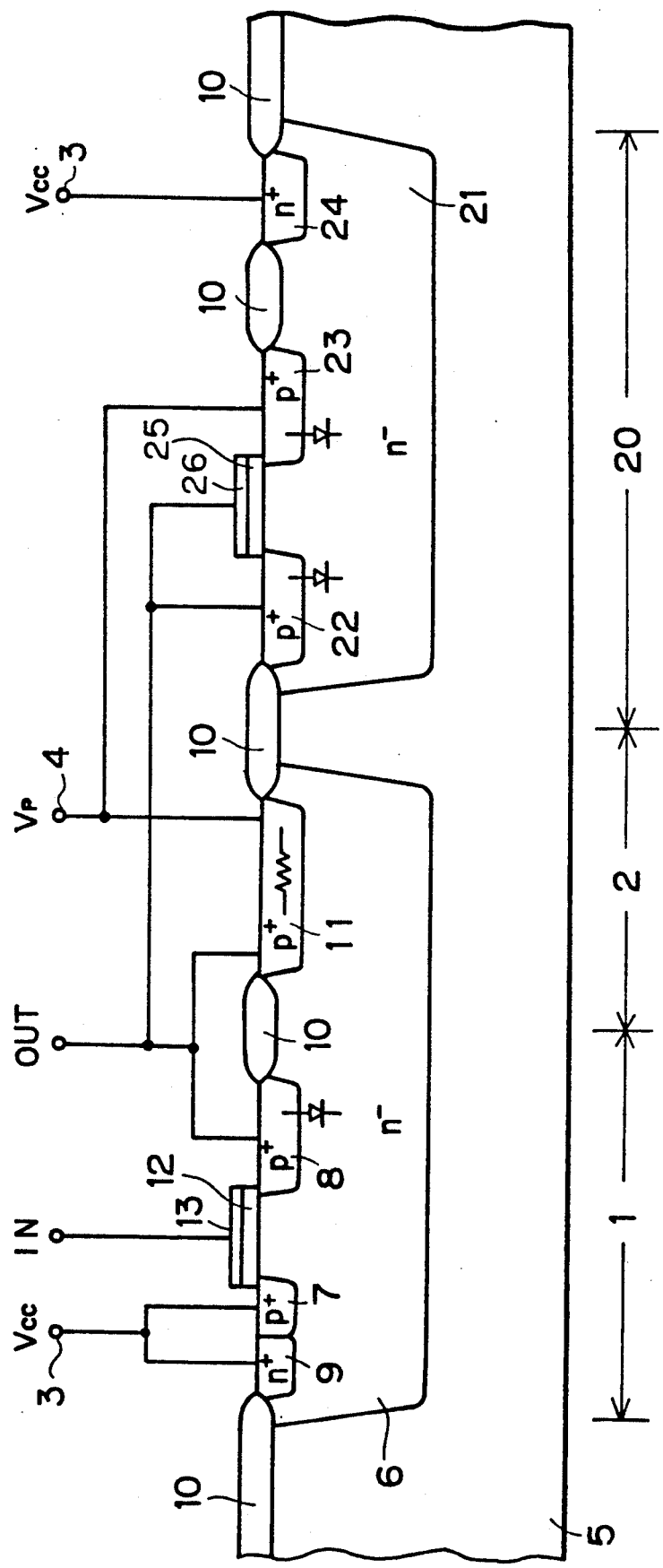
FIG. 2 is a sectional view schematically showing a semiconductor device implementing the circuit shown in FIG. 1.

FIG. 2 is a sectional view schematically showing a semiconductor device implementing the output circuit shown in FIG. 1. As shown in FIG. 2, an additional $n^-$-type well 21 for serving as the bulk of the p-channel MOS transistor 20 is formed on a first major surface side of a $p^-$-type substrate 5 to be adjacent to an $n^-$-type well 6. A $p^+$-type diffusion region 22 for serving as the drain of the p-channel MOS transistor 20 and another $p^+$-type diffusion region 23 for serving as the source thereof are provided on a surface side of the $n^-$-type well 21, to be spaced apart from each other. An $n^+$-type diffusion region 24 is provided adjacently to the $p^+$-type diffusion region 23 through a field oxide film 10. Further, a gate electrode 26 is formed on a region of the $n^-$-type well 21 held between the two $p^+$-type diffusion regions 22 and 23 through an insulating layer 25. Thus, the p-channel MOS transistor 20 is defined by the $n^-$-type well 21, the $p^+$-type diffusion regions 22 and 23, the insulating layer 25 and the gate electrode 26. The $p^+$-type diffusion region 22 and the gate electrode 26 are connected to the output terminal OUT, while the other $p^+$-type diffusion region 23 is connected to the power terminal 4. The n+-type diffusion region 24 is connected to the power terminal 3. As understood from FIG. 2, a parasitic diode 14 (see FIG. 1) is defined between the output terminal OUT and the power terminal 3 by p-n junction of the p+-type diffusion region 22 and the n−-type well 21, while another parasitic diode 27 (see FIG. 1) is defined between the power terminals 4 and 3 by p-n junction of the p+-type diffusion region 23 and the n−-type well 21.

While FIG. 2 shows the high breakdown voltage p-channel MOS transistors 1 and 20 in an ordinary transistor structure respectively for convenience of illustration, a high breakdown voltage structure implemented by a well-known technique such as double diffusion is appropriately selected and employed in an actual device. In order to implement a high breakdown voltage structure through double diffusion, for example, the source of the p-channel MOS transistor 1 is finished in a double diffusion structure of a $p^{31}$-type diffusion region 7a and a p+-type diffusion region 7b while the drain thereof is also finished in a double diffusion structure of a p−-type diffusion region 8a and a p+-type diffusion region 8b as shown in FIG. 3. Further, the n+-type diffusion region 9 is separated from the above source through the field oxide film 10. The source and the drain of the additional p-channel MOS transistor 20 are also formed through double diffusion respectively. However, the p-channel MOS transistors 1 and 20 of the high breakdown voltage structure are not substantially different in operation from those of the ordinary structure except for the point of breakdown voltage characteristics, and hence the description will be made below with reference to the device of the ordinary structure shown in FIG. 2.

The operation of the aforementioned output circuit is as follows: When the input terminal IN receives a low-level control signal in normal operation, the p-channel MOS transistor 1 is turned on to bring the output terminal OUT into a high-level potential ($V_{CC}=5$ V). When the input terminal IN receives a high-level control signal, on the other hand, the p-channel MOS transistor 1 is turned off to bring the output terminal OUT into a low-level potential ($V_P=-35$ V). Thus, the output terminal OUT takes a potential in a range between $V_{CC}$ (5 V) and $V_P$ (−35 V) and the p-channel MOS transistor 20 remains in an off state since the potential of its gate is higher than or identical to that of its source in normal operation. In this case, the p-channel MOS transistor 20 has sufficient breakdown voltage to exert no bad influence on the normal operation since the p-channel MOS transistor 20 has the aforementioned high breakdown voltage structure through double diffusion or the like similarly to the p-channel MOS transistor 1.

The p-channel MOS transistor 20 also remains in an off state when a plus surge is applied to the output terminal OUT, while a high withstand surge voltage is ensured since the surge current is passed through a path along the output terminal OUT→the parasitic diode 14 (the p+-type diffusion region 8→the n−-type well 6→the n+-type diffusion region 9 and the p+-tpe diffusion region 22→the n−-type well 21→the n+-type diffusion region 24)→the power terminal 3.

When a minus surge is applied to the output terminal OUT, on the other hand, the surge voltage is sufficiently lower than the negative potential $V_P$. Thus, the p-channel MOS transistor 20 enters an on state since the voltage of its gate becomes lower than that of its source, whereby the surge current is passed through a path along the power terminal 4→the p-channel MOS transistor 20→the output terminal OUT. Consequently, the p-channel MOS transistor 1 enters no breakdown mode but a withstand surge voltage against the minus surge is increased.

Thus, the withstand surge voltage can be increased with no bad influence exerted on the normal operation by adding the p-channel MOS transistor 20, and the chip size can be reduced since it is not necessary to widen the gate width of the p-channel MOS transistor 1 as a surge countermeasure dissimilarly to the conventional case.

Figure 4:
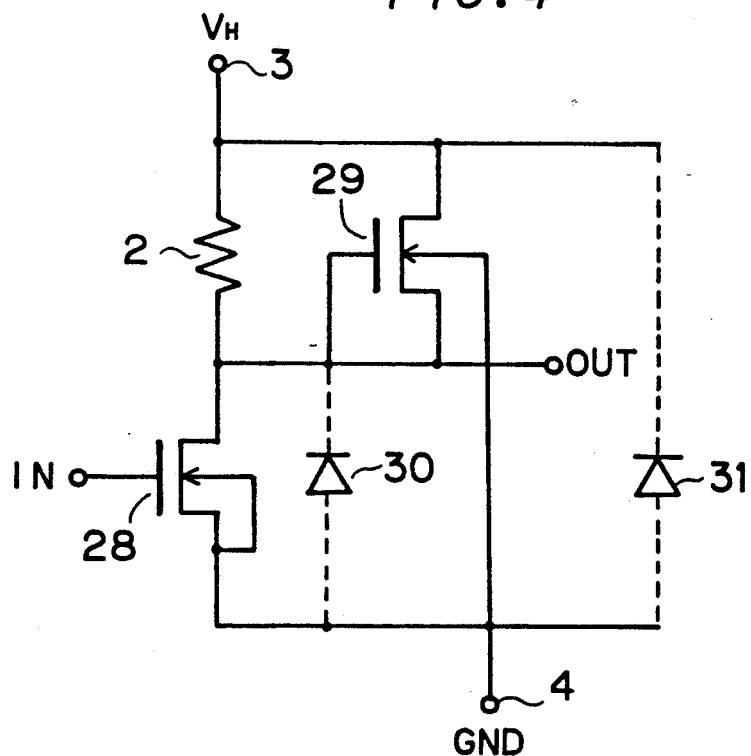
FIG. 4 illustrates a semiconductor integrated circuit according to another embodiment of the present invention.

FIG. 4 shows a semiconductor integrated circuit according to another embodiment of the present invention which is formed as an output circuit for a VFD driver.

As shown in FIG. 4, a high voltage $V_H$ is applied to a first power terminal 3 from a high-potential power source, while a second power terminal 4 is connected to GND (low-potential power source). Further, a high breakdown voltage n-channel MOS transistor 28 is employed as an output transistor, while another high breakdown voltage n-channel MOS transistor 29 is employed as a transistor for passing a surge current. The n-channel MOS transistor 28 is connected between the power terminal 4 and an output terminal OUT, while the n-channel MOS transistor 29 and a pulldown resistor 2 are connected between the power terminal 3 and the output terminal OUT. Other structures of this circuit are identical to that of the output circuit shown in FIG. 1, and hence the same or corresponding parts are denoted by the same reference numerals, to omit redundant description.

Figure 5:
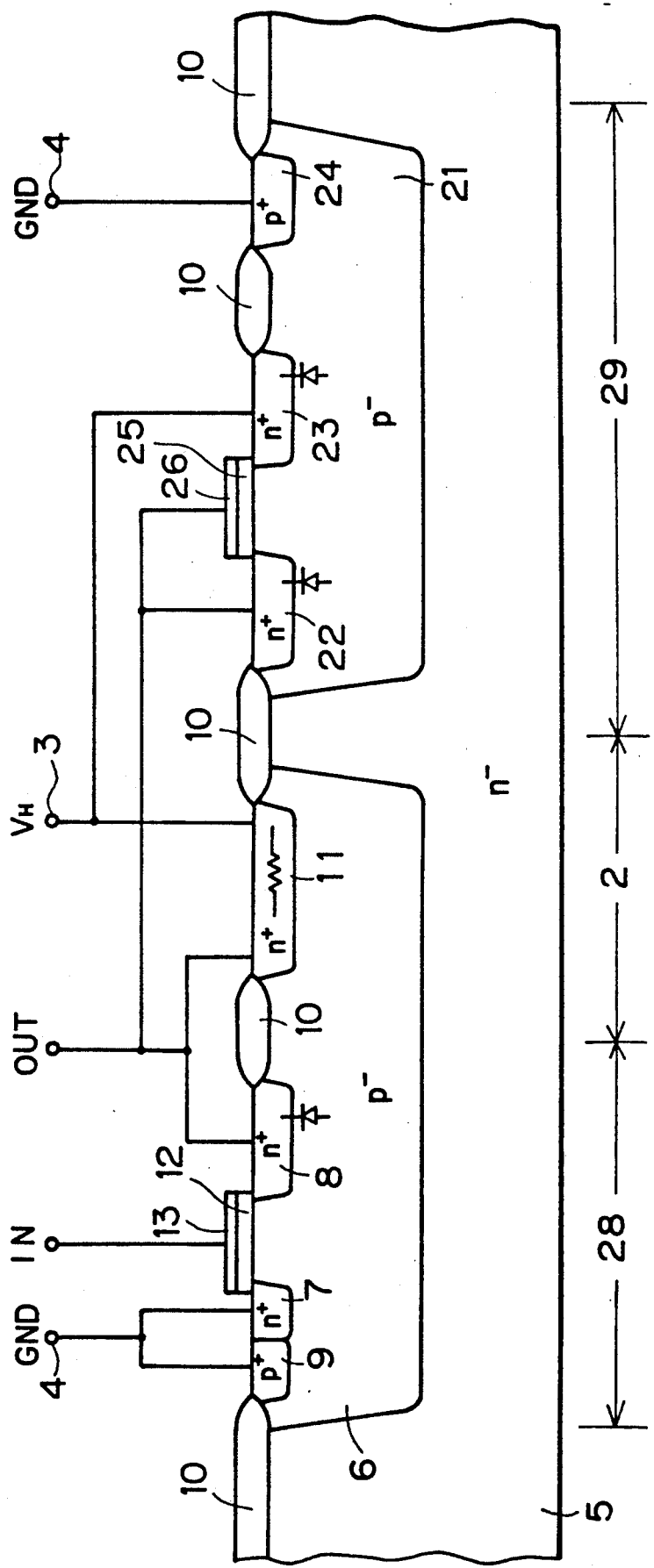
FIG. 5 is a sectional view schematically showing a semiconductor device implementing the circuit shown in FIG. 4.

FIG. 5 is a sectional view schematically showing a semiconductor device implementing the output circuit shown in FIG. 4. This semiconductor device is inverted in p-n attribute as compared with that shown in FIG. 2, while power terminals 3 and 4 are replaced with each other. Other structures are is identical to that shown in FIG. 2, and hence the same or corresponding parts are denoted by the same reference numerals to omit redundant description. A parasitic diode 30 (see FIG. 4) is defined by p-n junction of a p−-type well 6 and an n+-type diffusion region 8 and that of another p−-type well 21 and another n+-type diffusion region 22, while another parasitic diode 31 (see FIG. 4) is defined by p-n junction of the p−-type well 21 and still another n+-type diffusion region 23.

The operation of the aforementioned circuit is as follows: When an input terminal IN receives a high-level control signal in normal operation, the n-channel MOS transistor 28 is turned on so that the output terminal OUT goes low (GND potential). When the input terminal IN receives a low-level control signal, on the other hand, the n-channel MOS transistor 28 is turned off so that the output terminal OUT goes high ($V_H$). Thus, the output terminal OUT takes a potential in a range between GND and $V_H$, while the other n-channel MOS transistor 29 remains in an off state since the potential of its gate is lower than or identical to that of its source in the normal operation. Thus, the n-channel MOS transistor 29 exerts no bad influence on the normal operation.

The n-channel MOS transistor 29 also remains in an off state when a minus surge is applied to the output terminal OUT, while a high withstand surge voltage is ensured since the surge current is passed through a path along the power terminal 4→the parasitic diode 30→the output terminal OUT.

When a plus surge is applied to the output terminal OUT, on the other hand, the withstand surge voltage is reduced if no n-channel MOS transistor 29 is provided, since the surge current is passed by a breakdown phenomenon of the n-channel MOS transistor 28. However, this embodiment employs the n-channel MOS transistor 29, which enters an on state upon application of the plus surge since the potential of its gate becomes higher than that of its source. Thus, the surge current is passed through a path along the output terminal OUT→ the n-channel MOS transistor 29→the power terminal 3, whereby the n-channel MOS transistor 28 enters no breakdown mode but the withstand surge voltage against the plus surge is increased.

Each of the MOS transistors 20 and 29 shown in FIGS. 1 and 4 passes the surge current in an on state, whereby the ON resistance value is low and the surge current can be sufficiently passed without much increasing of the transistor size.

Although the load is formed by the resistor 2 in each of the above embodiments, such a load may be formed by a member other than the resistor, such as a relay or the like.

While each of the above embodiments has been described with reference to an output circuit for a driver of a vacuum fluorescent display, the present invention is also applicable to an output circuit such as a driver for a plasma display or the like, which requires a high withstand surge voltage exceeding 100 V.

Needless to say, the present invention is also applicable to all wafer processes including field effect transistors, for example MOS transistors such as CMOS, p-MOS, n-MOS and Bi-CMOS transistors.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor integrated circuit for improving a withstand surge voltage of an output circuit formed by high breakdown voltage field effect transistors, comprising:
    an input terminal for receiving a control signal;
    a first field effect transistor having a first electrode and a bulk connected to a first potential point, a control electrode connected to said input terminal and a second electrode;
    a load connected between said second electrode of said first field effect transistor and a second potential point;
    an output terminal connected to said second electrode of said first field effect transistor; and
    a second field effect transistor having a first electrode and a control electrode connected to said output terminal, a second electrode connected to said second potential point and a bulk connected to said first potential point.

2. A semiconductor integrated circuit in accordance with claim 1, wherein
    said first and second field effect transistors are p-channel MOS transistors respectively, and said first potential point is a high potential point while said second potential point is a low potential point.

3. A semiconductor integrated circuit in accordance with claim 1, wherein
    said first and second field effect transistors are n-channel MOS transistors respectively, and said first potential point is a low potential point while said second potential point is a high potential point.

4. A semiconductor integrated circuit in accordance with claim 1, wherein
    said first and second field effect transistors are high breakdown voltage transistors each of which has a source and a drain of double diffusion.

5. A semiconductor integrated circuit in accordance with either of claims 2 or 3, wherein said first and second field effect transistors are high breakdown voltage transistors each of which has a source and a drain of double diffusion.

* * * * *